Nov. 24, 1964 R. E. ANDERSON 3,158,504
METHOD OF ALLOYING AN OHMIC CONTACT TO A SEMICONDUCTOR
Filed Oct. 7, 1960
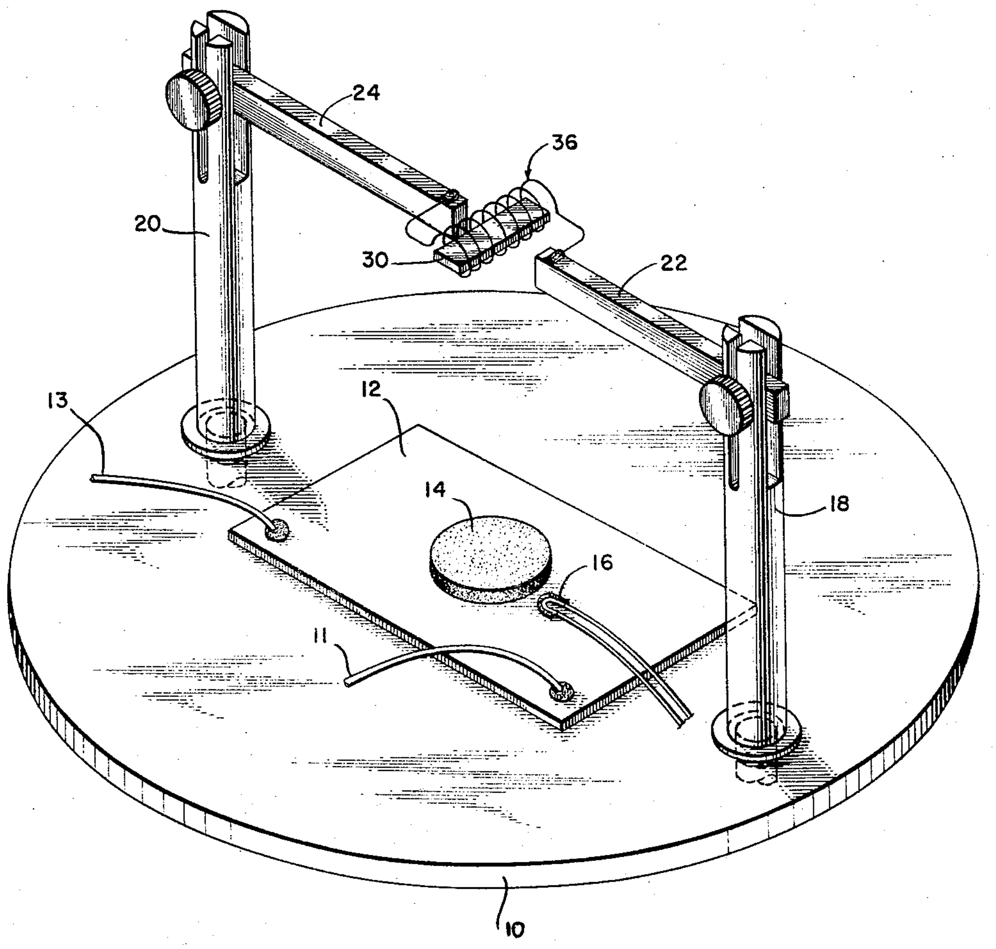
INVENTOR
Robert E. Anderson
BY
Stevens, Davis, Miller & Mosher
ATTORNEYS 3,158,504

METHOD OF ALLOYING AN OHMIC CONTACT TO A SEMICONDUCTOR

Robert E. Anderson, Dallas, Tex., assignor to Texas Instruments Incorporated, Dallas, Tex., a corporation of Delaware Filed Oct. 7, 1960, Ser. No. 61,310
5 Claims. (Cl. 117—213)

The present invention relates to a method of alloying an ohmic contact to a semiconductor body and more particularly to a method for forming an alloy contact on a silicon semiconductor wafer.

In the art of fabricating transistor devices, difficulty has been experienced in forming ohmic contacts on the various regions of the devices. This has been particularly true as regards the fabrication of diffused layer devices. As known, the technique currently in practice for forming a PN junction is solid state diffusion. By this technique, a PN junction is formed by diffusing impurity atoms of an opposite type conductivity to that characterizing a single crystal semiconductor wafer into one or more surfaces of the wafer. The depth of penetration of impurity atoms is not great, being of the order of fractions of a mil; nevertheless, such penetration does occur and PN junctions are formed. This means that at least one of the regions of the ensuing semiconductor device is very narrow and that great care must be taken when making a contact to this region to prevent the contact from going through the junction and shorting it out.

The normal technique for making contact to semiconductor devices of this type has been to evaporate a metal layer onto the desired region of the semiconductor body and thereafter alloy the metal layer into the semiconductor body. This technique has proven satisfactory in the past although some difficulties have been experienced. The most frequently heard complaint is that the film of metal that has been deposited on the semiconductive body alloys too deeply into the semiconductor body. It is to overcome this specific problem that the present invention was conceived.

It has been discovered that if a semiconductor is heated almost to the eutectic temperature of a contemplated alloy, and if the alloying material is vapor deposited from a source raised to its temperature of vaporization, the individual vapor particles will contain sufficient energy to momentarily raise the points of impact above the eutectic. Thus, alloy regrowth is essentially non-existent, and only an extremely thin alloy layer is produced.

A further aspect of the present invention is to provide more versatility in making ohmic contacts. In accordance with prior practice it is not possible to use all materials to obtain ohmic contacts. Thus, for example, when alloying aluminum into an N-type semiconductor region it is to be expected that a PN junction will be formed due to regrowth upon solidification of the contact material. This is, of course, true with a great variety of materials. According to prior practice it has only been possible to obtain an ohmic contact through the use of a material, such as aluminum, when the contact is made to P-type semiconductor material or very heavily doped N-type semiconductor material, frequently referred to in the art as N+ semiconductor material.

It is a further aspect of this invention to provide a novel method which will enable an ohmic contact to be made regardless of the materials employed. Thus, by following the teachings of the present invention it is possible and practical to obtain an ohmic contact to N-type semiconductor material using aluminum as a contact material. As can immediately be recognized, this invention constitutes a true advance in the art especially in this regard.

The above and foregoing are accomplished by the present invention through the practice of a highly unique and novel method for alloying an ohmic contact to a body of semiconductor material. The precise way that this is accomplished is to place a body of semiconductor material and a source of impurity material together in a vacuum chamber. The source of impurity material is placed in an evaporator, such as a tungsten coil, and the the body of semiconductor material is located in close proximity thereto to receive the metal particles as they issue forth from the evaporator. The semiconductor body is heated to a temperature below the eutectic temperature for the semiconductor material and the source impurity. It is most important that the temperature of the semiconductor body be held from about 40° C. to about 100° C. below this eutectic temperature. Upon the application of an electric current to the evaporator coil, the source impurity will begin evaporating and metal particles will be deposited onto the surface of the semiconductor body. Upon deposition, the metal particles first to arrive will alloy with the semiconductor surface. This occurs because the particles carry sufficient heat with them to raise the contact spots on the surface of the semiconductor body above eutectic temperature. In addition to the heat energy carried by the metal particles themselves, there is to be considered the radiant energy that is being emanated from the evaporator coil itself. A further consideration is that the kinetic energy of the particles is dissipated upon their arrival at the semiconductor surface and this energy manifests itself in the form of heat. All of these factors collectively serve to raise the temperature of the contact spots above eutectic temperature for the semiconductor material and the impurity material. Therefore alloying will take place at the contact spots for the first metal particles that strike the semiconductor surface. As will be immediately evident, alloying will cease face of the semiconductor wafer has received a full complement of metal particles. The metal particles which arrive subsequently will merely build up on the metal particles already alloyed in the semiconductor wafer. Due to the nature of the process described in the foregoing, the extent of alloying or depth of alloying is very slight, being in the order of 0.03 mil. This makes the process or method herein described compatible and exceptionally valuable in the forming of contacts on diffused layer semiconductor devices.

It is accordingly an object of the present invention to provide a method for alloying ohmic contacts to semiconductor bodies that can function to produce an alloyed contact of very small penetration into the semiconductor body, much smaller in fact than has heretofore been possible through the practice of the prior art.

It is a further object of the invention to provide a method for forming alloyed ohmic contacts to semiconductor materials which is able to form such contacts on all types of semiconductor materials, using all types of materials, without the possibility of forming a rectifying junction during alloying.

It is a still further object of the invention to provide a method for forming alloyed ohmic contacts to semiconductor bodies which can be carried out in an efficient and economical manner.

Other and further objects of the invention will become readily apparent from the following detailed description of a single preferred embodiment thereof and the best mode for carrying it out when taken in conjunction with the appended claims and the attached drawing which shows in the sole figure thereof the apparatus required to carry out the alloying method of the invention.

Referring now to the figure of the drawing, it will be noted that an electrically insulated table 10 is illustrated upon which is located a molybdenum plate 12. A suitable semiconductor wafer 14 is located on the molybdenum plate 12 and a thermocouple 16 is provided to insure that the temperature of the wafer 14 is maintained at a predetermined value. Leads 11 and 13 connected to plate 12 are, in turn, connected to a suitable power supply (not shown) for the purpose of maintaining the semiconductor wafer at a predetermined temperature lower than eutectic. It will be understood that the thermocouple 16 can be connected to control the power supply whereby the temperature of wafer 14 can be automatically governed. Two posts 18 and 20 are fitted through the table 10 and serve to hold electrode arms 22 and 24, respectively. A tungsten coil 36 is held between the ends of the two arms 22 and 24. As shown in the drawing, the ends of the coil 36 are attached to the ends of the two arms.

The entire assembly, as illustrated in the drawing, is housed within a suitable vacuum evaporation chamber (not shown), such as a bell chamber or the like, as is well known in the art. Upon application of an electric current through the arms 22 and 24 and the coil 36, the temperature of the tungsten coil will be raised to about 1200° C. to 1500° C. at which time it will be capable of imparting sufficient heat to an impurity source 30 positioned within the coil to cause particles of the impurity source to go into the vapor state. Those particles, or some of them, are deposited on the exposed surface of the semiconductor wafer 14. In the practice of the invention it is desirable that the wafer 14 be located in close proximity with the impurity source and tungsten coil. It is recommended that the wafer 14 be located a distance of about three or four inches from the coil and source.

In the practice of the invention, metal particles evaporated from the source 30, due to the application of electric current through the tungsten coil 36 from a power supply not shown, will deposit upon the exposed surface of the wafer 14. If the wafer 14 is maintained at a temperature from about 40° C. to about 100° C. below the eutectic temperature for the semiconductor wafer 14 and impurity material 30, the metal particles first striking the exposed surface of the semiconductor wafer 14 alloy into the surface of the wafer. The particles that first arrive at the exposed surface of the wafer will transfer their heat to the points of contact. In addition to this heat, there is also the heat derived from the particles themselves by virtue of the translation of their kinetic energy to heat energy upon striking the surface of the semiconductor body. Also there is a measure of radiant heat that is received directly from the tungsten coil 36. These three factors together serve to raise the temperature of the contact spots on the exposed surface of the semiconductor wafer to the eutectic temperature for the semiconductor wafer and the impurity material. Therefore, alloying takes place where the metal particles strike the semiconductor surface. Once the semiconductor surface is completely covered with a layer of metal particles, alloying stops and the metal particle subsequently arriving will merely deposit themselves onto the metal particles already alloyed with the semiconductor. Thus, there is only a build up of impurity material after the surface alloying.

In order to afford a better understanding of the present invention and a fuller appreciation of the scope thereof, examples illustrating the versatility of this method now follow.

In a specific example, a tungsten filament was used for the coil 36 and it was suspended between a pair of electrodes in the manner illustrated in the drawing. A piece of pure aluminum weighing approximately 300 mg. was placed inside of the tungsten coil. A silicon wafer 14 was rinsed in HF to remove any oxide and placed on the modybdenum plate 12. An electric current was passed through the molybdenum plate 12 for the purpose of heating the silicon wafer to a temperature of about 500° C. The thermocouple 16 was used in this connection to insure that sufficient current was passed through the molybdenum plate to maintain the temperature. The wafer was positioned approximately four inches away from the tungsten filament 36. The temperature of 500° C. is approximately 77° C. below the eutectic temperature for silicon and aluminum. As the current was passed through the tungsten coil, the aluminum held therein was vaporized. The evaporation took place in a vacuum of about $10^{-5}$ mm. of Hg or less. The time required to deposit a sufficient coating of aluminum onto the silicon wafer suitable for making a contact was found to be 15 to 20 seconds.

In another specific example of the present process, a wafer 14 of silicon was again positioned on the molybdenum plate 12 and an electric current passed therethrough, but this time to maintain a temperature of about 300° C. About 300 mg. of gold was placed in the tungsten coil 36. In this case, the silicon wafer was located a distance of about three inches from the tungsten coil. The system was brought to a vacuum of about $10^{-5}$ mm. of Hg, whereafter an electric current was passed through the tungsten coil to vaporize the gold charge held therein. The entire charge was evaporated onto the silicon wafer. Thereafter, the silicon wafer was cooled to less than 100° C. and an additional 300 mg. of gold was placed in the tungsten coil 36 and evaporated onto the cooled wafer. The second layer was considerably brighter than the first. Upon testing the alloy contact formed by the first deposited gold, it was found that the depth of penetration of the alloying was about 0.03 mil.

The above process was repeated for both gold and aluminum using germanium as the semiconductor material. In the case of gold, the germanium was held at a temperature of 275° C., and in the case of aluminum the germanium was held at a temperature of 375° C. Both of these temperatures are approximately 50 to 85° C. below the eutectic temperatures for the combinations of gold-germanium and aluminum-germanium. In both cases, the gold and aluminum was deposited onto the germanium surface and an alloy contact was formed having a depth of penetration of less than 0.1 mil.

As is evident from the foregoing, the process of the present invention has applicability with regard to all types of semiconductor materials and also with regard to all types of contact materials whether they be active or conductivity affecting impurity materials or not. In all cases, regardless of the selection of semiconductor material and contact material, an ohmic contact is formed by alloying the contact material very slightly into the surface of the semiconductor material. This represents a departure from the teachings of the prior art wherein it is only possible to alloy in certain contact materials to obtain ohmic connections. This is particularly true as regard the use of so-called active impurity materials when applied to bodies of semiconductor material containing impurity material of opposite conductivity type. Thus, the present invention represents an advance over the prior art in this regard.

A further aspect of the present invention stems from the ability to control the depth of penetration of the alloy contact. This is especially important in the fabrication of diffused layer semiconductor devices. Diffused layers formed in semiconductor devices are very thin, less than 1 mil and frequently of the order of .15 to .3 mil in thickness. Therefore, it is essential that any contact made to such a layer shall not penetrate or alloy into the semiconductor material deeper than the junction formed by the diffused layer. To do otherwise would effectively short out the junction and render its presence useless.

Although the present invention has been shown and described with reference to a single preferred embodiment and specific examples have been given showing how the method of the invention is carried out, nevertheless changes and modifications will occur to those skilled in the art which, in fact, do not depart from the teachings of the present invention. Such changes and modifications are deemed to be within the scope and spirit of the invention as defined in the appended claims.

What is claimed is:

1. A method for forming an ohmic contact to a silicon body that comprises positioning a silicon body in proximity to a source of gold in a vacuum, heating the silicon body to a temperature of about 300° C., and evaporating the gold so that vaporized particles thereof are deposited upon the surface of the silicon body to form an alloy therewith.

2. A method for forming an ohmic contact to a silicon body that comprises positioning a silicon body in proximity to a source of aluminum in a vacuum, heating the semiconductor body to a temperature of about 500° C., and evaporating the aluminum so that vaporized particles thereof are deposited upon the surface of the silicon body to form an alloy therewith.

3. A method for forming an ohmic contact to a germanium body that comprises positioning a germanium body in proximity to a source of gold in a vacuum, heating the germanium body to a temperature of about 275° C., and evaporating the gold so that vaporized particles thereof are deposited upon the surface of the germanium body to form an alloy therewith.

4. A method for forming an ohmic contact to a germanium body that comprises positioning a germanium body in proximity to a source of aluminum in a vacuum, heating the body to a temperature of about 375° C., and evaporating thea luminum so that vaporized particles thereof are deposited upon the surface of the germanium body to form an alloy therewith.

5. A method for forming an ohmic contact to a semiconductor body that comprises positioning a semiconductor body in proximity to a source of contact material in a vacuum, heating the semiconductor body to a temperature from about 40° C. to about 100° C. below the eutectic temperature for the semiconductor body and the contact material, and evaporating the contact material so that vaporized particles thereof are deposited upon the surface of the semiconductor body to form an alloy therewith.

References Cited in the file of this patent

UNITED STATES PATENTS

| | | |
|---|---|---|
| 2,879,188 | Strull | Mar. 24, 1959 |
| 2,965,519 | Christensen | Dec. 20, 1960 |
| 2,969,296 | Walsh | Jan. 24, 1961 |
| 3,028,663 | Iwersen et al. | Apr. 10, 1962 |